(12) United States Patent
Wang et al.

(10) Patent No.: US 12,015,108 B2
(45) Date of Patent: Jun. 18, 2024

(54) LIGHT EMITTING DEVICE AND MANUFACTURING METHOD THEREOF

(71) Applicant: Najing Technology Corporation Limited, Zhejiang (CN)

(72) Inventors: Hailin Wang, Zhejiang (CN); Yunjian Lan, Zhejiang (CN); Xiangpeng Du, Zhejiang (CN)

(73) Assignee: Najing Technology Corporation Limited, Zhejiang (CN)

( * ) Notice: Subject to any disclaimer, the term of this patent is extended or adjusted under 35 U.S.C. 154(b) by 662 days.

(21) Appl. No.: 17/261,035

(22) PCT Filed: Apr. 29, 2019

(86) PCT No.: PCT/CN2019/085025
§ 371 (c)(1),
(2) Date: Jan. 18, 2021

(87) PCT Pub. No.: WO2020/015432
PCT Pub. Date: Jan. 23, 2020

(65) Prior Publication Data
US 2021/0265538 A1    Aug. 26, 2021

(30) Foreign Application Priority Data

Jul. 20, 2018 (CN) ......................... 201810806506.X

(51) Int. Cl.
*H01L 33/56* (2010.01)
*C09K 11/54* (2006.01)
(Continued)

(52) U.S. Cl.
CPC .............. *H01L 33/56* (2013.01); *C09K 11/54* (2013.01); *H01L 33/44* (2013.01); *H10K 85/10* (2023.02);
(Continued)

(58) Field of Classification Search
CPC ... H01L 33/56; H01L 33/44; H01L 2933/005; H10K 85/10; H10K 50/115; C09K 11/54; B82Y 20/00; B82Y 30/00; B82Y 40/00
(Continued)

(56) References Cited

U.S. PATENT DOCUMENTS 10,290,776 B1 * 5/2019 Fan .................. H01L 33/504
2015/0034875 A1 * 2/2015 Kwon ............... H01L 33/501
252/301.36
(Continued)

FOREIGN PATENT DOCUMENTS

CN    102217106 A    10/2011
CN    102505173 A    6/2012
(Continued)

*Primary Examiner* — Igwe U Anya
(74) *Attorney, Agent, or Firm* — Samson G. Yu

(57) ABSTRACT

The disclosure provides a light emitting device and a manufacturing method thereof. The light emitting device includes a substrate, an LED chip, a quantum dot composite layer and a first protective layer; the LED chip is disposed on a surface of the substrate; the quantum dot composite layer is arranged on a surface of the LED chip away from the substrate; the first protective layer is arranged on a surface of the quantum dot composite layer away from the LED chip; wherein the quantum dot composite layer includes a water-soluble polymer matrix and quantum dots dispersed in the water-soluble polymer matrix; the material of the first protective layer is one of a first inorganic oxide and a first water-blocking polymer; and the material of the water-soluble polymer matrix is an oxygen-blocking polymer.

13 Claims, 4 Drawing Sheets

(51) Int. Cl.
*H01L 33/44* (2010.01)
*H10K 50/115* (2023.01)
*H10K 85/10* (2023.01)
*B82Y 20/00* (2011.01)
*B82Y 30/00* (2011.01)
*B82Y 40/00* (2011.01)

(52) U.S. Cl.
CPC ............... *B82Y 20/00* (2013.01); *B82Y 30/00* (2013.01); *B82Y 40/00* (2013.01); *H01L 2933/005* (2013.01); *H10K 50/115* (2023.02)

(58) Field of Classification Search
USPC .......................................................... 257/40
See application file for complete search history.

(56) References Cited

U.S. PATENT DOCUMENTS

| | | | | |
|---|---|---|---|---|
| 2015/0184066 | A1* | 7/2015 | Kwon | H01L 33/507 977/774 |
| 2015/0301257 | A1* | 10/2015 | Choi | F21V 3/049 359/885 |
| 2016/0161066 | A1* | 6/2016 | Sung | C09K 11/703 252/301.36 |
| 2017/0152436 | A1 | 6/2017 | Jang et al. | |

FOREIGN PATENT DOCUMENTS

| | | | | |
|---|---|---|---|---|
| CN | 105885419 | A | | 8/2016 |
| CN | 106188398 | A | | 12/2016 |
| CN | 106653985 | A | | 5/2017 |
| CN | 106753333 | A | | 5/2017 |
| CN | 107650452 | A | | 2/2018 |
| CN | 108922958 | A * | 11/2018 | ............ H01L 33/504 |
| KR | 20130043294 | A * | 4/2013 | ............. H01L 33/50 |
| WO | 2010058162 | A2 | | 5/2010 |
| WO | 2016046845 | A1 | | 3/2016 |
| WO | 2017075534 | A1 | | 5/2017 |

* cited by examiner

LIGHT EMITTING DEVICE AND MANUFACTURING METHOD THEREOF

CROSS REFERENCE TO RELATED APPLICATIONS

This application is a national application of PCT/CN2019085025, filed on Apr. 29, 2019. The contents of PCT/CN2019085025 are all hereby incorporated by reference.

TECHNICAL FIELD

This disclosure relates to the field of quantum dot light emitting materials, in particular, to a light emitting device and a manufacturing method thereof.

BACKGROUND

Due to the very small size, mostly 1-10 nm, quantum dots have a very large specific surface area, a large number of unpaired electrons and unsaturated dangling bonds on the surface lead to extremely unstable chemical properties, and extreme sensitivity to oxygen and water. Since there are a large number of unpaired electrons and unsaturated dangling bonds on the surface of quantum dots, on the one hand, the stability of quantum dots can be improved through the design of core-shell structure, and on the other hand, the stability of quantum dots can be improved through ligand modification on the surface of quantum dots.

The current method for fixing quantum dots is usually as follows: quantum dots are added to UV or thermal curable polymers, and cured by means of addition reaction or condensation reaction to form a stable QDs-matrix structure. In addition, there is also a method that quantum dots are added to a solution of PMMA or other polymers, which are solidified by volatilizing solvents to form QDs-PMMA dispersions. However, these treatments can hardly avoid the accelerated movement of the molecular chain caused by different expansion coefficient between the quantum dots and the polymer, which creates a small changeable and instantaneous channel through which water vapor and oxygen can pass, resulting in increase of water and oxygen intrusion into the system.

For the above reasons, it is necessary to improve the water and oxygen barrier properties of quantum dot light emitting devices.

SUMMARY

The main purpose of this disclosure is to provide a light emitting device and a manufacturing method thereof, so as to solve the problem of insufficient water and oxygen barrier properties of the quantum dot light emitting devices in the prior art.

To achieve the aforesaid objectives, according to one aspect of the present disclosure, there is provided a light emitting device, wherein including: a substrate; an LED chip disposed on a surface of the substrate; a quantum dot composite layer arranged on a surface of the LED chip away from the substrate; and a first protective layer arranged on a surface of the quantum dot composite layer away from the LED chip; wherein, the quantum dot composite layer includes a water-soluble polymer matrix and quantum dots dispersed in the water-soluble polymer matrix, and the material of the first protective layer is one of a first inorganic oxide and a first water-blocking polymer, and the material of the water-soluble polymer matrix is an oxygen-blocking polymer.

Further, the light emitting device further includes a second protective layer, and the material of the second protective layer is one of a second inorganic oxide and a second water-blocking polymer; preferably, the first inorganic oxide and the second inorganic oxide are each independently selected from at least one of silicon dioxide and aluminum oxide; preferably, the first water-blocking polymer and the second water-blocking polymer are each independently selected from one or more of polyvinylidene chloride, poly(vinylidene fluoride), polytetrafluoroethylene and polychlorotrifluoroethene.

Further, the material of the first protective layer is the first inorganic oxide, and the first protective layer is formed by providing one or more solutions of an organic silicate, an organic aluminum silicate and a silazane on the surface of the quantum dot composite layer, and hydrolyzing for solidification.

Further, the light emitting device further includes a third protective layer and a fourth protective layer, and the third protective layer and the fourth protective layer are respectively disposed on two opposing surfaces of the quantum dot composite layer, and the material of the third protective layer and the fourth protective layer is an oxygen-blocking polymer.

Further, the material of the quantum dot composite layer includes a water-soluble polymer matrix and a microstructure dispersed in the water-soluble polymer matrix, and the microstructure includes a quantum dot and a dispersion medium for dispersing the quantum dot, wherein, the polarity of the water-soluble polymer matrix is opposite to the polarity of the quantum dot, and the polarity of the water-soluble polymer matrix is opposite to the polarity of the dispersion medium.

Further, the quantum dot is an oil-soluble quantum dot, and the dispersion medium is one of a quantum dot solvent and a hydrophobic polymer; preferably, the quantum dot solvent is a nonpolar organic solvent; preferably, the nonpolar organic solvent has a boiling point of ≥100° C.; more preferably, the nonpolar organic solvent is one or more of olefin, alkane, fatty acid, and fatty amine; preferably, the hydrophobic polymer is selected from one or more of compounds represented by the following structures of Formula I, Formula II and Formula III:

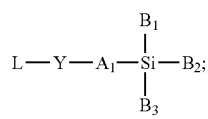

Formula I

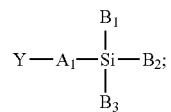

Formula II

Formula III the $A_1$ is

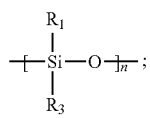

the $A_2$ is

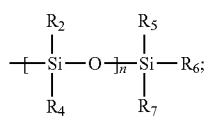

the n is 6~30;

the $R_1$, the $R_2$, the $R_3$ and the $R_4$ are selected independently from any one of methyl, siloxy, phenyl, or combination thereof;

the $R_5$, the $R_6$ and the $R_7$ are selected independently from any one of methyl, phenyl, or combination thereof;

the $B_1$ and the $B_2$ are selected independently from any one of methyl, phenyl, or combination thereof, and the $B_2$ is selected from one of

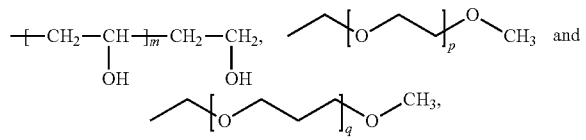

and the m, the p and the q are independently 2~10; preferably, a carbon polymerization degree of the $B_2$ is ≤10, more preferably 5;

the Y is a $C_3$~$C_{16}$ branched or straight chain alkane segment;

the L is one of an amino, carboxyl and sulfhydryl group.

Further, when the dispersion medium is the quantum dot solvent, the microstructure further includes a quantum dot carrier where the quantum dot is loaded, and the quantum dot carrier loaded with the quantum dot is dispersed in the quantum dot solvent; preferably, the quantum dot carrier is a mesoporous material, and the quantum dot is located in a pore or on a surface of the mesoporous material; more preferably, the mesoporous material is at least one of a silica mesoporous material and an alumina mesoporous material.

Further, when the dispersion medium is the quantum dot solvent, the microstructure further includes a free ligand, and the free ligand is dispersed in the quantum dot solvent; preferably, the free ligand is one or more of fatty acid, fatty acid salt, fatty amine, organic phosphine and thiol; more preferably, the free ligand is one or more of tri-n-octylphosphine, oleic acid and zinc oleate.

Further, the material of the water-soluble polymer matrix is one or more of polyvinylpyrrolidone, polyacrylamide, polyvinyl alcohol, polyacrylic acid, cellulose, alkyd resin and polyurethane, preferably polyvinyl alcohol; preferably, a weight ratio of the quantum dot to the water-soluble polymer matrix is 0.1-30:100; a weight ratio of the quantum dot to the dispersion medium is 1-100:100.

According to another aspect of the present disclosure, there is provided a manufacturing method of the aforesaid light emitting device, wherein including steps of: providing a substrate; disposing an LED chip on a surface of the substrate; arranging a quantum dot composite layer on a surface of the LED chip away from the substrate; and arranging a first protective layer on a surface of the quantum dot composite layer away from the LED chip to obtain a light emitting device; wherein, the quantum dot composite layer includes a water-soluble polymer matrix and quantum dots dispersed in the water-soluble polymer matrix, and the material of the first protective layer is one of a first inorganic oxide and a first water-blocking polymer, and the material of the water-soluble polymer matrix is an oxygen-blocking polymer.

Further, before the step of arranging the quantum dot composite layer on the surface of the LED chip, the manufacturing method further includes a step of disposing a second protective layer on a surface of the quantum dot composite layer, and in the step of arranging the quantum dot composite layer on the surface of the LED chip, disposing the second protective layer close to the LED chip; wherein the material of the second protective layer is one of a second inorganic oxide and a second water-blocking polymer.

Further, the material of the first protective layer is the first inorganic oxide, and the step of arranging the first protective layer includes: preparing a coating solution of the first protective layer, coating, spraying or pouring the coating solution of the first protective layer onto the surface of the quantum dot composite layer away from the LED chip, and hydrolyzing for solidification to form the first protective layer; wherein, the coating solution of the first protective layer includes a coating solvent and one or more of an organic silicate, an organic aluminum silicate and a silazane dissolved in the coating solvent.

Further, the organic silicate is tetraethyl silicate, the organic aluminum silicate is bis(sec-butyl)triethylaluminum orthosilicate, and the silazane is perhydropolysilazane; preferably, the coating solvent is one or more of tetrahydrofuran, ethyl acetate and acetone.

Further, before the step of arranging the quantum dot composite layer on the surface of the LED chip, the manufacturing method further includes a step of disposing a third protective layer on the surface of the LED chip; before the step of arranging the first protective layer on the surface of the quantum dot composite layer, the manufacturing method further includes disposing a fourth protective layer on the surface away from the third protective layer of the quantum dot composite layer; the material of the third protective layer and the fourth protective layer is an oxygen-blocking polymer.

This disclosure provides a light emitting device, which includes a substrate, an LED chip, a quantum dot composite layer, and a first protective layer; the LED chip is disposed on a surface of the substrate; the quantum dot composite layer is arranged on a surface of the LED chip away from the substrate; the first protective layer is arranged on a surface of the quantum dot composite layer away from the LED chip; wherein, the quantum dot composite layer includes a water-soluble polymer matrix and quantum dots dispersed in the water-soluble polymer matrix, and the material of the first protective layer is a first inorganic oxide. The light emitting device is provided with a first inorganic oxide layer as a protective layer on the surface of the quantum dot composite layer away from the LED chip, which can effectively encapsulate the surface defects of the quantum dot composite layer, and form water-oxygen barrier, and play an effective protective role. At the same time, a water-soluble polymer matrix is used as the polymer matrix of the quantum dot composite layer, which has good bonding performance with the first protective layer and can block oxygen at the same time. And compared with other polymeric material, water-soluble polymer has better dispersion capability for quantum dots, with an expansion coefficient closer to the expansion coefficient of quantum dots. Several factors make the quantum dot composite layer have better stability and reduced surface defects, further improving water and oxygen barrier properties of the light emitting device.

BRIEF DESCRIPTION OF THE DRAWINGS

The accompanying drawings, which constitute a part of this application, are used to provide a further understanding of the disclosure, and the exemplary embodiments of the disclosure and the description thereof are used to explain the disclosure, but do not constitute improper limitations to the disclosure. In the drawings.

DETAILED DESCRIPTION

It should be noted that the embodiments of the present disclosure and the features of the embodiments may be combined with each other in case of no conflict. The disclosure will be described in detail below with reference to the figures and in conjunction with the embodiments.

As used herein, the singular forms "a," "an" and "the" are intended to include the plural forms as well, unless the context clearly indicates otherwise.

The term "on a/the surface" is intended to include the meaning of "above a/the surface" as well, unless the context clearly indicates otherwise.

The following describes this disclosure in further detail with reference to specific embodiments, which cannot be understood as limiting the scope of protection claimed in this disclosure.

As described in the background section of this disclosure, the quantum dot light emitting devices in the prior art have insufficient water and oxygen barrier properties.

Figure 1:
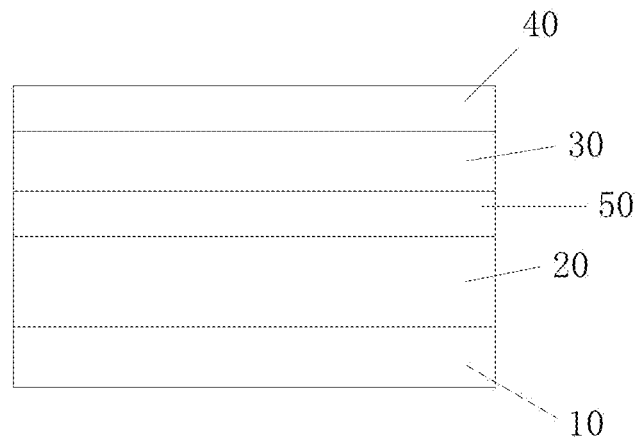
FIG. 1 shows a schematic structural diagram of a light emitting device according to an embodiment of this disclosure.

In order to solve this problem, this disclosure provides a light emitting device, as shown in FIG. 1, which includes a substrate 10, an LED chip 20, a quantum dot composite layer 30, and a first protective layer 40. The LED chip 20 is disposed on a surface of the substrate 10; the quantum dot composite layer 30 is arranged on the surface of the LED chip 20 away from the substrate 10; the first protective layer 40 is arranged on a surface of the quantum dot composite layer 30 away from the LED chip 20; wherein, the quantum dot composite layer 30 includes a water-soluble polymer matrix and quantum dots dispersed in the water-soluble polymer matrix, and the material of the first protective layer 40 is one of a first inorganic oxide and a first water-blocking polymer, and the material of the water-soluble polymer matrix is an oxygen-blocking polymer.

The above light emitting device provided by the present disclosure is provided with a first inorganic oxide layer or a first water-blocking polymer as a protective layer on the surface of the quantum dot composite layer away from the LED chip, which can effectively encapsulate the surface defects of the quantum dot composite layer, and form water-oxygen barrier, and play an effective protective role. At the same time, a water-soluble polymer matrix is used as the polymer matrix of the quantum dot composite layer, which has good bonding performance with the first protective layer and can block oxygen at the same time. Compared with other polymeric materials, water-soluble polymers have better dispersion capability for quantum dots, with an expansion coefficient closer to the expansion coefficient of quantum dots. Several factors make the quantum dot composite layer have better stability and reduced surface defects, further improving water and oxygen barrier properties of the light emitting device.

In some embodiments, as shown in FIG. 1, the light emitting device further includes a second protective layer 50, and the material of the second protective layer 50 is one of a second inorganic oxide and a second water-blocking polymer. This can further improve the water and oxygen barrier properties of the light emitting device. In some embodiments, the first inorganic oxide and the second inorganic oxide are each independently selected from at least one of silicon dioxide and aluminum oxide. As protective layers, silicon dioxide and aluminum oxide can further prevent water and oxygen from intruding the quantum dot composite layer 30 due to their compact structures. In some embodiments, the first water-blocking polymer and the second water-blocking polymer have a water vapor transmission ratio less than or equal to 5 $g/m^2 \times 24$ h under the conditions of 38° C. and a relative humidity of 90%, for example, the first water-blocking polymer and the second water-blocking polymer are respectively selected from one or more of polyvinylidene chloride (PVDC), poly (vinylidene fluoride) (PVDF), polytetrafluoroethylene (PTFE) and polychlorotrifluoroethene (PCTFE).

In some embodiments, the material of the first protective layer 40 is a first inorganic oxide, and the first protective layer 40 is formed by providing one or more solutions of an organic silicate, an organic aluminum silicate and a silazane on the surface of the quantum dot composite layer 30, and hydrolyzing for solidification. In some embodiments, when the material of the second protective layer 50 is a second inorganic oxide, the second protective layer 50 is formed by providing one or more solutions of an organic silicate, an organic aluminum silicate and a silazane on the surface of the quantum dot composite layer 30, and hydrolyzing for solidification. The organic silicate, organic aluminum silicate and silazane themselves can be hydrolyzed to produce silicon oxide or aluminum oxide in the presence of $H_2O$ (which can be derived from air), and moreover, the water-soluble polymer matrix in the quantum dot composite layer 30 in this disclosure such as PVA can also provide hydroxyl groups; through the hydrolysis reaction, the cross-linking with the water-soluble polymer matrix (i.e. silazane and PVA hydroxyl undergo dehydration condensation, PVA hydroxyl and Si(Al)—O—R undergo dealcoholization condensation) can form a more compact protective layer, thereby further improving the water and oxygen barrier properties.

In some embodiments, the aforesaid light emitting device further includes a third protective layer and a fourth protective layer, which are respectively disposed on the opposing surfaces of the quantum dot composite layer 30, and the material of the third protective layer and the fourth protective layer is an oxygen-blocking polymer. When preparing the light emitting device, the quantum dot composite layer 30 may form small pores during the volatilization or drying of the solvent of the water-soluble polymer material, the oxygen-blocking polymer is further disposed on the opposing surfaces of the quantum dot composite layer 30 in order to block these small pores that are not conducive to blocking water and oxygen, for further improving the water and oxygen barrier properties. In some embodiments, the oxygen-blocking polymer of the third protective layer and the fourth protective layer and the oxygen-blocking polymer of the water-soluble polymer matrix are the same material. In some embodiments, the oxygen transmission ratio of the oxygen-blocking polymer tinder the conditions of 38° C. and a relative humidity of 0% is less than or equal to 5 cm³/m²×24 h×0.1 MPa.

Figure 2:
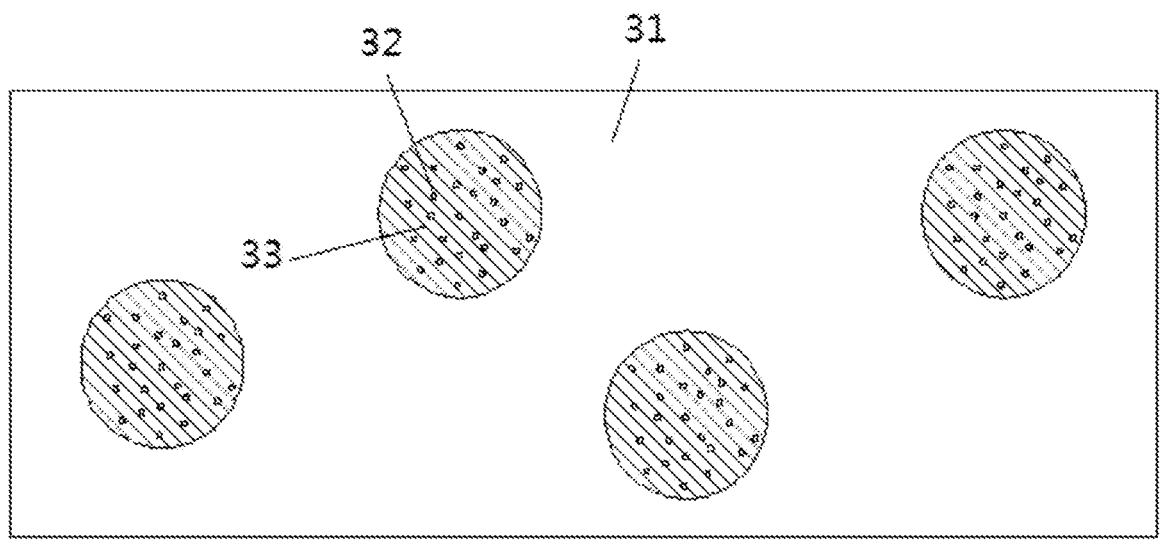
FIG. 2 shows a schematic structural diagram of a quantum dot composite layer according to an embodiment of this disclosure.

In some embodiments, as shown in FIG. 2, the material of the quantum dot composite layer 30 includes a water-soluble polymer matrix 31 and a microstructure dispersed in the water-soluble polymer matrix 31. The microstructure includes a quantum dot 32 and a dispersion medium 33 for dispersing the quantum dot 32, wherein, the polarity of the water-soluble polymer matrix 31 is opposite to the polarity of the quantum dot 32, and the polarity of the water-soluble polymer matrix 31 is opposite to the polarity of the dispersion medium 33.

Since the polarity of the water-soluble polymer matrix is opposite to the polarity of the quantum dot, and the polarity of the water-soluble polymer matrix is opposite to the polarity of the dispersion medium, the aforesaid dispersion medium and quantum dot can form the microstructure with good dispersion of the quantum dot, and the microstructure can be more stably dispersed in the water-soluble polymer matrix. The above reasons make the quantum dot composite layer have better stability. Secondly, because the quantum dot is dispersed in the dispersion medium, the dispersion medium acts as a barrier between the quantum dot and the water-soluble polymer matrix, which is conducive to avoiding direct contact between the quantum dot and the water-soluble polymer matrix, thus ensuring the long-term stability and high quantum yield.

In some embodiments, the aforesaid microstructure is a nanometer or micrometer-scale microstructure, and the microstructure is not limited to the circular structure shown in FIG. 2, which is only a simple illustration.

In some embodiments, the quantum dot is an oil-soluble quantum dot, and the dispersion medium is one of a quantum dot solvent and a hydrophobic polymer. The quantum dot is stably dispersed in the quantum dot solvent, and the quantum dot solvent can block the damage to the quantum dot by the polymer, so that the quantum dot composite layer can maintain high quantum yield. The aforesaid quantum dot solvent may be selected from some solvents commonly used in this field. The quantum dot is preferably, but not limited to, the oil-soluble quantum dot, and the quantum dot solvent is a nonpolar organic solvent. The nonpolar organic solvent is hydrophobic, which can reduce the probability of quantum dot contacting with water vapor. And the good compatibility of the nonpolar organic solvent with the oil-soluble quantum dot makes the dispersion of the quantum dot more stable. In some embodiments, the nonpolar organic solvent has a boiling point of ≥100° C., and the solvent is liquid state at room temperature (i.e. 20° C.), which is conducive to reducing the volatilization of the quantum dot solvent during the use of the quantum dot composite and maintaining the microstructure morphology.

In some embodiments, the nonpolar organic solvent is one or more of olefin, alkane, fatty acid, and fatty amine; in some embodiments, the nonpolar organic solvent is one or more of octadecene, octadecane, oleic acid and oleylamine.

In some embodiments, the quantum dot solvent includes two or more solvents, and the boiling point of each solvent is ≥100° C. In some embodiments, the boiling point of each quantum dot solvent is ≥150° C. In some embodiments, the boiling point of each quantum dot solvent is ≥200° C.

In some embodiments, the hydrophobic polymer is selected from one or more of the compounds represented by the following structures of Formula I, Formula II and Formula III:

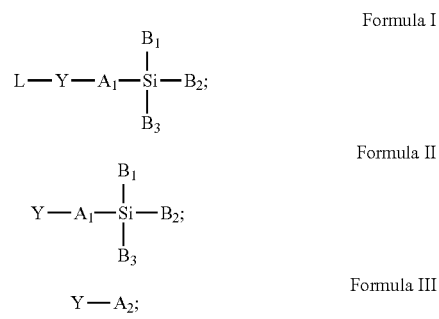

$A_1$ is

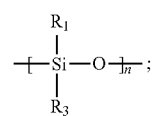

$A_2$ is

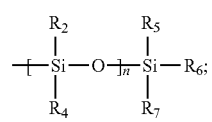

n is 6~30;

$R_1$, $R_2$, $R_3$ and $R_4$ are selected independently from any one of methyl, siloxy, phenyl, or combination thereof;

$R_5$, $R_6$ and $R_7$ are selected independently from any one of methyl, phenyl, or combination thereof;

$B_1$ and $B_3$ are selected independently from any one of methyl, phenyl, or combination thereof, and $B_2$ is selected from one of

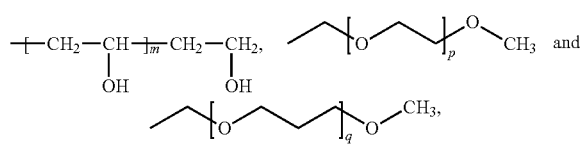

and m, p and q are independently 2~10;

Y is a $C_3$~$C_{16}$ branched or straight chain alkane segment;

L is one of an amino, carboxyl and sulfhydryl group.

The aforesaid hydrophobic polymer is a siloxane oligomer, which has a good affinity with quantum dot, and the quantum dot can be stably dispersed therein. And the aforesaid siloxane oligomer has good water barrier property, which can further improve the water and oxygen barrier properties of the composite. In order to further improve the compatibility between the siloxane oligomer and the quantum dot, and further improve the mixing performance of the two during processing, in some embodiments, the carbon polymerization degree of $B_2$ is ≤10, and the carbon polymerization degree of $B_2$ is preferably 5.

In some embodiments, when the dispersion medium is a quantum dot solvent, the microstructure further includes a quantum dot carrier where the quantum dot is loaded, and the quantum dot carrier loaded with the quantum dot is dispersed in the quantum dot solvent. Loading the quantum dot on the quantum dot carrier can further reduce the chance of contact between the quantum dot and the water-soluble polymer matrix on the one hand, and is also conducive to making the quantum dot more stably dispersed in the quantum dot solvent on the other hand. These two factors make the quantum dot composite layer have better stability and higher quantum yield. In some embodiments, the quantum dot carrier is a mesoporous material, and the quantum dot is located in the pore or on the surface of the mesoporous material. In some embodiments, the mesoporous material is at least one of a silica mesoporous material and an alumina mesoporous material.

In some embodiments, when the dispersion medium is a quantum dot solvent, the microstructure further includes a free ligand, and the free ligand is dispersed in the quantum dot solvent. The free ligand may be a ligand that can act as a solvent for quantum dots or a ligand that cannot act as a solvent for quantum dots. Generally, there are ligands on the surface of quantum dots, and additional free ligands will surround the surface of quantum dots to further protect the quantum dots.

In some embodiments, the free ligand is one or more of fatty acid, fatty acid salt, fatty amine, organic phosphine and thiol; in some embodiments, the free ligand is one or more of tri-n-octylphosphine, oleic acid and zinc oleate. Free ligand can bind to or fall off from the surface of quantum dots at room temperature, which is a dynamic process.

The inventors found that in the process of forming the polymer matrix, the active groups that easily generate free radicals, such as unsaturated double bonds, active amino groups, and sulfhydryl groups carried by the polymer precursor, can easily reduce the efficiency of quantum dots. Therefore, in this disclosure, a polymer matrix that does not generate free radicals during the preparation of the quantum dot composite layer is more preferred, and the material of the polymer matrix may include one or more materials. For example, the materials forming the polymer matrix do not require any polymer precursor, that is, no need to undergo a polymerization reaction to generate a polymer matrix material, and the water-soluble polymer includes, but not limited to, one or more of polyvinylpyrrolidone, polyacrylamide, polyvinyl alcohol, polyacrylic acid, cellulose, alkyd resin and polyurethane. In some embodiments, the material of the polymer matrix has good properties of blocking water or oxygen or concurrently blocking water and oxygen, such as polyvinyl alcohol (PVA). The specific molecular weight of polyvinyl alcohol can be selected according to the requirements of actual process and product performance.

In some embodiments, the material of the aforesaid polymer matrix may also be a polymer that needs polymerization, that is, free radicals are generated in the reaction between the polymer precursors. As the quantum dot solvent is used as spacer between the quantum dots and the polymer, the damage caused by free radicals to the quantum dots can be reduced.

In some embodiments, the weight ratio of the quantum dot to the water-soluble polymer matrix is 0.1-30:100; the weight ratio of the quantum dot to the dispersion medium is 1-100:100. The weight ratio of the quantum dot to the water-soluble polymer matrix can be selected according to actual application requirements, for example, according to the needs of luminous intensity. In some embodiments, the weight ratio of the quantum dot to the water-soluble polymer matrix is 0.1-30:100. The inventors found that the weight ratio of quantum dot to the quantum dot solvent can affect the transmission ratio of excitation light in the composite, and preferably a weight ratio of 1-100:100 can achieve better transmission ratio. The inventors also found that the amount of solvent needs to be considered according to the final product morphology of the quantum dot composite layer, because the amount of solvent also affects the film-forming property of the polymer. When the solvent-based ligand is included in the quantum dot composite, the weight of the ligand is calculated into the weight of the quantum dot solvent.

According to another aspect of this disclosure, there is also provided a manufacturing method of light emitting device, which includes the following steps: providing a substrate 10; disposing an LED chip 20 on a surface of the substrate 10; arranging a quantum dot composite layer 30 on a surface of the LED chip 20 away from the substrate 10; and arranging a first protective layer 40 on a surface of the quantum dot composite layer 30 away from the LED chip 20 to obtain a light emitting device; wherein, the quantum dot composite layer 30 includes a water-soluble polymer matrix and quantum dots dispersed in the water-soluble polymer matrix, and the material of the first protective layer 40 is one of a first inorganic oxide and a first water-blocking polymer, and the material of the water-soluble polymer matrix is an oxygen-blocking polymer. In some embodiments, the oxygen transmission ratio of the oxygen-blocking polymer under the conditions of 38° C. and a relative humidity of 0% is less than or equal to 5 $cm^3/m^2 \times 24$ h×0.1 MPa.

The light emitting device prepared by the above preparation method is provided with a first inorganic oxide layer or a first water-blocking polymer as a protective layer on the surface of the quantum dot composite layer away from the LED chip, which can effectively encapsulate the surface defects of the quantum dot composite layer, and form water-oxygen barrier, and play an effective protective role. At the same time, a water-soluble polymer matrix is used as the polymer matrix of the quantum dot composite layer, which has good bonding performance with the first protective layer and can block oxygen at the same time. Compared with other polymeric materials, water-soluble polymers have better dispersion capability for quantum dots, with an expansion coefficient closer to the expansion coefficient of quantum dots. Several factors make the quantum dot composite layer have better stability and reduced surface defects, further improving water and oxygen barrier properties of the light emitting device.

In some embodiments, before the step of arranging the quantum dot composite layer 30 on the surface of the LED chip 20, the manufacturing method further includes a step of disposing a second protective layer 50 on the surface of the quantum dot composite layer 30, and in the step of arranging the quantum dot composite layer 30 on the surface of the LED chip 20, the second protective layer 50 is disposed close to the LED chip 20; wherein the material of the second protective layer 50 is a second inorganic oxide or a second water-blocking polymer. This can further improve the water and oxygen barrier properties of the light emitting device.

In some embodiments, when the material of the first protective layer 40 is a first inorganic oxide, the step of arranging the first protective layer 40 includes: preparing a coating solution of the first protective layer, coating, spraying or pouring the coating solution of the first protective layer onto the surface of the quantum dot composite layer 30 away from the LED chip 20 and hydrolyzing for solidification to form the first protective layer 40; when the material of the second protective layer 50 is a second inorganic oxide, the step of arranging the second protective layer 50 includes: preparing a coating solution of the second protective layer, coating, spraying or pouring of the coating solution of the second protective layer on the surface of the quantum dot composite layer 30, close to the LED chip 20 and hydrolyzing for solidification to form the second protective layer 50; wherein, the coating solution of the first protective layer and the coating solution of the second protective layer independently include a coating solvent and one or more of an organic silicate, an organic aluminum silicate and a silazane dissolved in the coating solvent. The organic silicate, organic aluminum silicate and silazane themselves can be hydrolyzed to produce silicon oxide or aluminum oxide in the presence of $H_2O$ (which can be derived from air), and moreover, the water-soluble polymer matrix in the quantum dot composite layer 30 in this disclosure such as PVA can also provide hydroxyl groups; through the hydrolysis reaction, the protective layer material cross-links with the water-soluble polymer matrix (i.e. silazane and PVA hydroxyl undergo dehydration condensation, while PVA hydroxyl and Si(Al)—O—R undergo dealcoholization condensation), which can form a more compact protective layer, thereby further improving the water and oxygen barrier properties.

In some embodiments, when the first protective layer 40 and the second protective layer 50 are inorganic oxide layers, in addition to coating method, evaporation or vapor deposition method also can be used to provide them. In some embodiments, when the material of the first protective layer 40 is a first water-blocking polymer and the material of the second protective layer 50 is a second water-blocking polymer, the step of disposing the second protective layer 50 includes: coating, spraying or pouring the coating solution of the water-blocking polymer onto the corresponding surface of the quantum dot composite layer 30, and then heating to dry the solvent to form the first protective layer 40 and the second protective layer 50; wherein, the coating solution of the first water-blocking polymer and the second water-blocking polymer respectively include a coating solvent and one or more of PVDF, PVDC, PTFE and PCTFE dissolved in the coating solvent. In the process of solvent volatilization of emulsions or solutions of PVDF, PVDC, PTFE and PCTFE, the polymer slowly aggregates into a film and adheres to the surface of the quantum dot composite layer 30 to protect the materials from water vapor penetration. In some embodiments, the aforesaid coating solvent includes, but not limited to, one or more of THF, DMF, DMSO, DMP, DCM and TCM.

In some embodiments, the organic silicate is tetraethyl silicate, the organic aluminum silicate is bis(sec-butyl)triethylaluminum orthosilicate, and the silazane is perhydropolysilazane; the coating solvent is preferably but not limited to one or more of tetrahydrofuran, ethyl acetate and acetone.

In some embodiments, before the step of arranging the quantum dot composite layer 30 on the surface of the LED chip 20, the manufacturing method further includes a step of disposing a third protective layer on the surface of the LED chip 20; before arranging a first protective layer 40 on the surface of the quantum dot composite layer 30, the manufacturing method further includes disposing a fourth protective layer on the surface of the quantum dot composite layer 30 away from the third protective layer; the material of the third protective layer and the fourth protective layer is an oxygen-blocking polymer. When preparing the light emitting device, the quantum dot composite layer 30 may form small pores during the volatilization or drying of the solvent of the water-soluble polymer material, so the oxygen-blocking polymer is further disposed on the opposing surfaces of the quantum dot composite layer 30 in order to block these small pores that are not conducive to blocking water and oxygen, for further improving the water and oxygen barrier properties. In some embodiments, the oxygen-blocking polymer of the third protective layer and the fourth protective layer and the oxygen-blocking polymer of the water-soluble polymer matrix are the same material. In some embodiments, the oxygen transmission ratio of the oxygen-blocking polymer under the conditions of 38° C. and a relative humidity of 0% is less than or equal to 5 $cm^3/m^2 \times 24$ h$\times$0.1 MPa.

In some embodiments, the step of arranging the quantum dot composite layer 30 includes: mixing and dispersing the quantum dots, the dispersion medium of the quantum dots, the material of the water-soluble polymer matrix, and a first auxiliary solvent for dissolving the material of the water-soluble polymer matrix to obtain a dispersion; coating the dispersion on the surface of the LED chip 20 away from the substrate 10, and then removing the first auxiliary solvent in the dispersion to form the quantum dot composite layer 30; wherein, the polarity of water-soluble polymer matrix is opposite to the polarity of the quantum dots, and the polarity of the water-soluble polymer matrix is opposite to the polarity of the dispersion medium.

In the aforesaid manufacturing method, the quantum dots, the material of water-soluble polymer matrix, the first auxiliary solvent and the dispersion medium are mixed to obtain a dispersion. Since the polarity of the water-soluble polymer matrix is opposite to the polarity of the quantum dots, and the polarity of the water-soluble polymer matrix is opposite to the polarity of the dispersion medium, the microemulsion phase formed by the quantum dots and the dispersion medium in this process can be more uniformly dispersed in the first auxiliary solvent which is used for dissolving the material of water-soluble polymer matrix. In the process of removing the solvent, the first auxiliary solvent for dissolving the material of water-soluble polymer matrix evaporates away. Along with the formation of water-soluble polymer matrix, a plurality of microstructures are formed by the dispersion medium and the quantum dots dispersed therein, which are stably dispersed in the water-soluble polymer matrix.

The quantum dot composite layer obtained by the aforesaid manufacturing method has good stability. Secondly, because the quantum dots are dispersed in the dispersion medium, the dispersion medium acts as a barrier between the quantum dots and the water-soluble polymer matrix, which is conducive to avoiding direct contact between the quantum dots and the water-soluble polymer matrix, thus ensuring the long-term stability and high quantum yield.

In some embodiments, the quantum dot is an oil-soluble quantum dot, the dispersion medium is one of a quantum dot solvent and a hydrophobic polymer, and the boiling point of the quantum dot solvent is higher than the boiling point of the first auxiliary solvent; in some embodiments, the quantum dot solvent is a nonpolar organic solvent; in some embodiments, the nonpolar organic solvent has a boiling point of ≥100° C.; in some embodiments, the nonpolar organic solvent is one or more of olefin, alkane, fatty acid and fatty amine; in some embodiments, the first auxiliary solvent is water.

In some embodiments, when the dispersion medium is a quantum dot solvent, a quantum dot carrier is added to the system at the same time during the mixing process; or, before the mixing step, the manufacturing method further includes a step of loading the quantum dot on the quantum dot carrier. Loading the quantum dot on the quantum dot carrier can further reduce the chance of contact between the quantum dot and the water-soluble polymer matrix on the one hand, and is also conducive to making the quantum dot more stably dispersed in the quantum dot solvent on the other hand. These two factors make the quantum dot composite layer have better stability and higher quantum yield.

In some embodiments, when the dispersion medium is a quantum dot solvent, a free ligand is added to the system at the same time during the mixing process. In this way, the free ligand can also be dispersed in the quantum dot solvent. The free ligand may be a solvent-based ligand or a non-solvent-based ligand. Generally, there are ligands on the surface of quantum dots, and additional free ligands will surround the surface of quantum dots to further protect the quantum dots.

In some embodiments, when the dispersion medium is a quantum dot solvent, a second auxiliary solvent having a polarity opposite to the polarity of the water-soluble polymer matrix and a boiling point less than or equal to the boiling point of the first auxiliary solvent is added to the system at the same time during the mixing process. The use of the second auxiliary solvent is conducive to further improving the emulsification effect of the system. Moreover, the aforesaid second auxiliary solvent can also be used as a quantum dot dispersant. On the one hand, adding the second auxiliary solvent can reduce the content of the quantum dot solvent with a high boiling point in the final quantum dot composite, and on the other hand, adding the second auxiliary solvent with a low boiling point can play a role of diluting quantum dots, without increasing the amount of solvent in the composite due to its capability of complete volatilization. After the first auxiliary solvent and the second auxiliary solvent are volatilized completely, the microstructure can still exist. In some embodiments, the second auxiliary solvent includes, but not limited to, one or more of dichloromethane, chloroform, and hexane.

In some embodiments, when the dispersion medium is a hydrophobic polymer, the step of preparing the dispersion includes: mixing the quantum dots, a third auxiliary solvent of the quantum dots, and the hydrophobic polymer to obtain a premix; mixing and dispersing the premix, the material of water-soluble polymer matrix and the first auxiliary solvent to obtain a dispersion; wherein the boiling point of the third auxiliary solvent is lower than the boiling point of the first auxiliary solvent, and in the step of removing the first auxiliary solvent, the third auxiliary solvent is removed at the same time. Use of the third auxiliary solvent can better dissolve the hydrophobic polymer, disperse the quantum dots, and form a more stable microemulsion phase. Since the boiling point of the third auxiliary solvent is lower than the boiling point of the first auxiliary solvent, in the step of removing the first auxiliary solvent, the third auxiliary solvent in the microemulsion phase can also volatilize away. With the formation of the water-soluble polymer matrix, the hydrophobic polymer and the quantum dots dispersed therein gradually form a plurality of microstructures, which are stably dispersed in the polymer matrix.

In some embodiments, the third auxiliary solvent includes but not limited to one or more of dichloromethane, chloroform, and hexane.

The following embodiments further illustrate the beneficial effects of this disclosure.

Preparation of Quantum Dot Composite Layer

I. Using Quantum Dot Solvent as Dispersion Medium

Embodiment 1

Prepare the aqueous PVA polymer (polymerization degree of 17,000, molecular weight of about 75,000, alcoholysis degree greater than 98%) solution (i.e. a mixture of material of polymer matrix and water as a first auxiliary solvent), and prepare CdSe/CdS quantum dot solution (i.e. a mixture of quantum dots, a quantum dot solvent and a second auxiliary solvent). The quantum dot solution was added to the aqueous polymer solution, and a mixture with a microstructure was formed at 3,000 rpm with stirring for 3 minutes, as the quantum dot composite solution. The prepared coating solution of the second protective layer was provided by spraying on the chip (the chip was pre-installed on the substrate), and after solidification was completed, the quantum dot composite solution was provided on the second protective layer by the same means, so that a wet film with a thickness of 100 microns was formed. Then volatilize the solvents, including the second auxiliary solvent to be volatilized firstly (vacuum drying at 25° C. under vacuum of 10 Pa) and the first auxiliary solvent to be volatilized secondly (two-step heating to prevent the formation of micropores after volatilization, firstly at 50° C. for 30 minutes and then at 80° C. for 30 minutes), a quantum dot composite layer with a thickness of 10 microns was obtained. After solidification was completed, the coating solution of the first protective layer was provided on the quantum dot composite layer by the same means and solidified, and then the preparation of the QLED (quantum dot light emitting diode) was completed.

The aforesaid coating solution of the first protective layer and coating solution of the second protective layer were both tetrahydrofuran solutions of bis(sec-butyl)triethylaluminum orthosilicate. After coating, hydrolysis and solidification occurred to form a protective layer containing both silicon dioxide and aluminum oxide.

Figure 3:
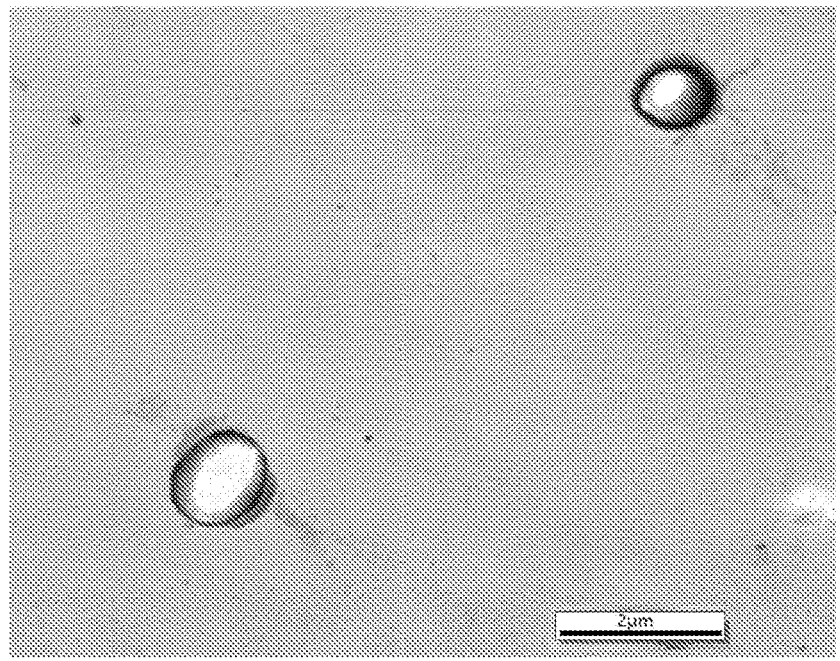
FIG. 3 shows an SEM graph of the quantum dot composite layer in the Embodiment 1 of this disclosure, where the microstructures are dispersed in the polymer.
Figure 4:
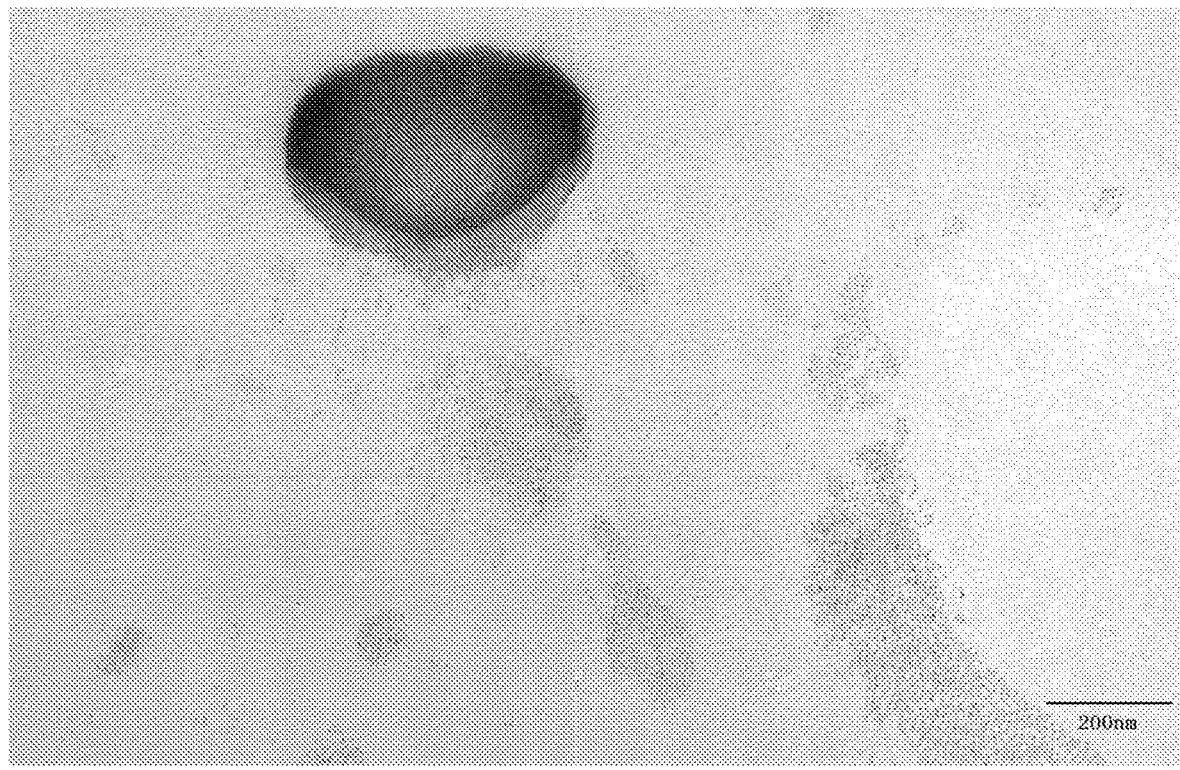
FIG. 4 shows an SEM graph of a single microstructure in the quantum dot composite layer in Embodiment 1 of this disclosure.
Figure 5:
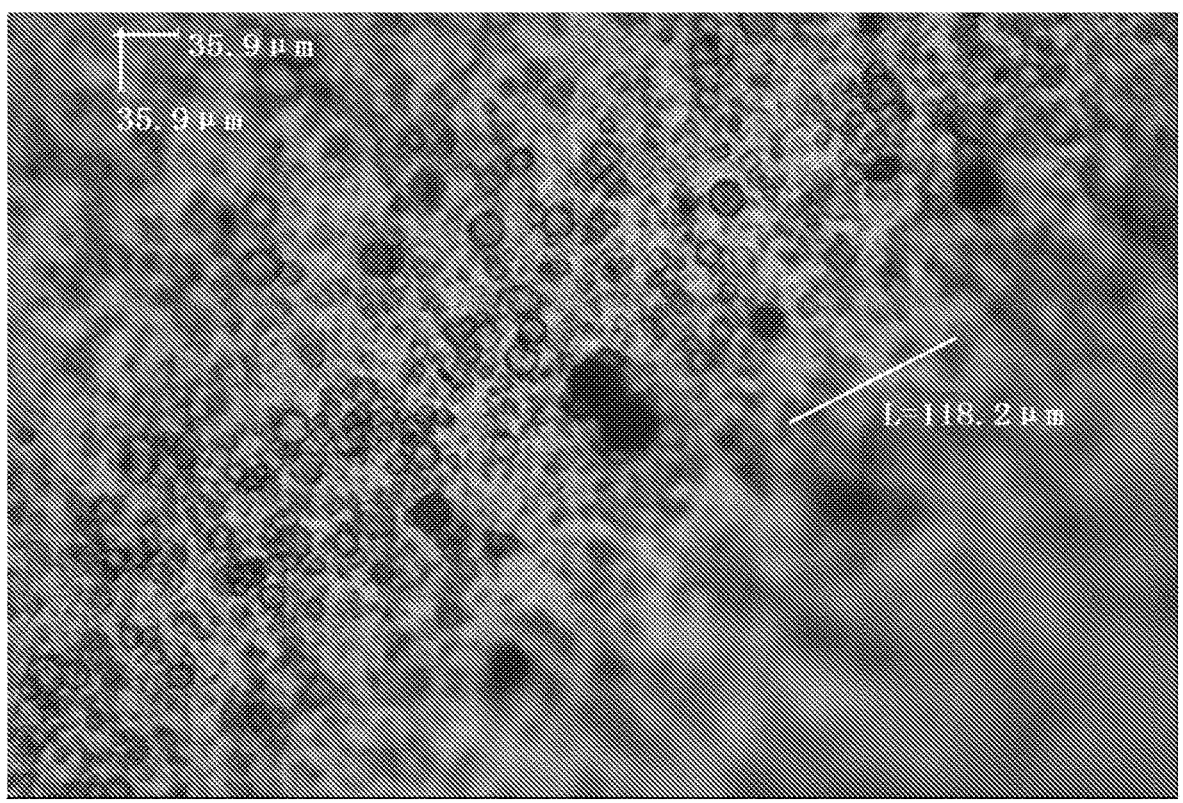
FIG. 5 shows an optical micrograph of the quantum dot composite layer in Embodiment 1 of this disclosure.

The SEM graphs of the quantum dot composite layer prepared above are shown in FIGS. 3 and 4. The bright spots in the figures represent microemulsion bubbles, and the black materials seen at the edges are quantum dots. Since the microemulsion was in a liquid state, in case of slicing the layer, the emulsion bubbles were broken and the quantum dots leaked out of the emulsion bubbles so that such a TEM picture was observed. The composite layer was observed under an optical microscope, and as shown in FIG. 5, a plurality of microstructures dispersed in the PVA matrix can be observed.

See Table 1 for the specific raw materials, and Table 2 for the ratio between the amounts of the raw materials.

Embodiments 2 to 8

Embodiments 2 to 8 used the same steps as in Embodiment 1, using the preparation parameters shown in Table 1 and Table 2. The mixing conditions and volatilization conditions were the same as in Embodiment 1.

The method for preparing quantum dots using fumed silicon dioxide as a carrier in Embodiment 7 was to mix a toluene solution of quantum dots with porous fumed silicon dioxide, and the product was obtained by oscillation for 24 hours, centrifugation, washing and vacuum drying.

Comparative Embodiment 1

Using 0.1 g of oil-soluble quantum dots, 100 g of anti-oxidative and polymerization-inhibiting acrylate, and 0.1 g of photoinitiator as raw materials, perform mechanical stirring and mixing at 3,000 rpm for 3 minutes, coat 10 μm of the stirred raw materials on the chip (the chip was pre-installed on the substrate), and then conduct UV solidification under a 365 nm wavelength light source to obtain a QLED including a quantum dot composite layer with a thickness of 10 μm.

TABLE 1

Types of raw materials used in each embodiment

| Embodiment | Polymer matrix material | First auxiliary solvent | Quantum dot | Second auxiliary solvent | Quantum dot solvent | | Non-solvent-based ligand |
|---|---|---|---|---|---|---|---|
| | | | | | First part (Solvent-based ligand) | Second part | |
| 1 | PVA | Water | Oil-soluble quantum dot | Dichloromethane | TOP | Octadecene (ODE) | Zinc oleate |
| 2 | PVA | Water | Oil-soluble quantum dot | Dichloromethane | / | ODE | Zinc oleate |
| 3 | PVA | Water | Oil-soluble quantum dot | Hexane | TOP, oleic acid | / | / |
| 4 | PVA | Water | Oil-soluble quantum dot | Hexane | TOP, oleic acid | / | / |
| 5 | PVA | Water | Oil-soluble quantum dot | Chloroform | TOP | ODE | / |
| 6 | PVA | Water | Oil-soluble quantum dot | Dichloromethane | TOP | ODE | / |
| 7 | PVA | Water | Quantum dot using fumed silicon dioxide as a carrier | Dichloromethane | TOP | ODE | / |
| 8 | PVA | Water | Oil-soluble quantum dot | Dichloromethane | | ODE | / |

It should be noted that when the quantum dot composite contained a solvent-based ligand, the weight of the ligand was calculated into the weight of the quantum dot solvent.

TABLE 2

Preparation conditions of each embodiment

| Embodiment | Mass of polymer (g) | Mass of first auxiliary solvent (g) | Mass of quantum dot (g) | Mass of second auxiliary solvent (g) | Quantum dot solvent | | Mass of non-solvent-based ligand (g) |
|---|---|---|---|---|---|---|---|
| | | | | | First part (g) | Second part (g) | |
| 1 | 100 | 900 | 0.1 | 50 | 1 | 9 | 0.1 |
| 2 | 100 | 900 | 0.1 | 100 | 0 | 1 | 0.05 |
| 3 | 100 | 900 | 0.5 | 50 | 5 | 0 | / |
| 4 | 100 | 900 | 1 | 50 | 10 | 0 | / |
| 5 | 100 | 900 | 5 | 50 | 5 | 20 | / |
| 6 | 100 | 900 | 10 | 40 | 0.2 | 19.8 | / |
| 7 | 100 | 900 | 30 | 30 | 1.5 | 28.5 | / |
| 8 | 100 | 900 | 0.1 | 50 | 0 | 10 | / |

Testing:

The characterization method of aging stability was as follows:

The performance of the light emitting devices prepared in each of the aforesaid embodiments and comparative embodiments were tested, using the specific testing methods as follows, and the testing results are shown in Table 3.

The method for testing the quantum yield of QLEDs was: using an Everfine integrating sphere to test the average blue light spectrum of the same batch of blue-emissive LED chips lit at a current of 50 mA as the blue light reference spectrum, and then measuring the white light spectrum of the aged sample lit at a current of 50 mA.

The quantum yield of QLED=emission peak area of quantum dots in the spectrum of the aged sample/(blue light reference peak area−blue light peak area in the spectrum of the aged sample)*100%

The measurement methods of luminescence stability mainly included 80 mA lighting aging at room temperature, high temperature and humidity (65° C./95% RH), high temperature storage (85° C.) and other aging conditions, and measurement of the change of quantum yield of QLED at a current of 50 mA before and after 1000 h of aging.

The aging data is shown in Table 3:

TABLE 3

| | | Quantum yield after 1000 h of aging | | |
|---|---|---|---|---|
| | Initial quantum yield | 80 mA lighting at room temperature | High temperature and humidity | High temperature storage |
| Embodiment 1 | 103.4% | 100.5% | 99.1% | 101.8% |
| Embodiment 2 | 105.5% | 107.4% | 98.3% | 102.7% |
| Embodiment 3 | 97.5% | 97.4% | 94.5% | 91.4% |
| Embodiment 4 | 98.1% | 99.8% | 91.3% | 94.4% |
| Embodiment 5 | 103.4 | 105.6% | 94.5% | 97.9% |
| Embodiment 6 | 105.0% | 108.5% | 96.5% | 97.6% |
| Embodiment 7 | 103.4% | 105.7% | 95.6% | 98.6% |
| Embodiment 8 | 103.5% | 104.6% | 90.1% | 89.0% |
| Comparative Embodiment 1 | 100.0% | 35.5% | 51.4% | 57.4% |

Note:
The above quantum yields are relative quantum yields. The quantum yield of Comparative Embodiment 1 is set as 100%, and the other quantum yields mean the corresponding percentages.

Note: The above quantum yields are relative quantum yields. The quantum yield of Comparative Embodiment 1 is set as 100%, and the other quantum yields mean the corresponding percentages.

II. Using Hydrophobic Polymer as Dispersion Medium

Embodiment 9

Synthesis of the Following Siloxane Oligomer:

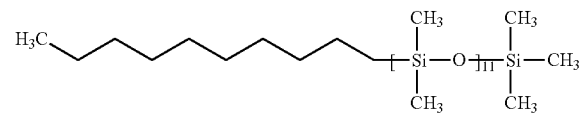

Raw materials: DMS-H11 (gelest), decene (sigma-aldrich), trimethylmethoxysilane (sigma-aldrich), tris(pentafluorophenyl)borane (sigma-aldrich), Platinum(0)-1,3-divinyl-1,1,3,3-tetramethyldisiloxane (sigma-aldrich).

Add 20 g DMS-H11 and 20 mL anhydrous toluene into a 100 mL three-necked flask, replace with nitrogen for 20 minutes, and add a mixture of 2.67 g decene, 0.01 g Platinum(0)-1,3-divinyl-1,1,3,3-tetramethyldisiloxane and 10 mL toluene into a 50 mL dropping funnel. After the three-necked flask was stirred and heated to 110° C., begin to add the decene mixture dropwise for consecutive 20 minutes, and keep it at 110° C. for 60 minutes. After cooling, add 10 g activated carbon, followed by centrifugation, filtration, chromatographic separation and rotary evaporation to obtain the following product:

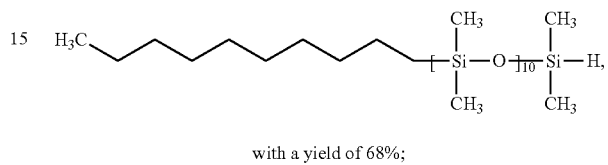

with a yield of 68%;

Re-dissolve 10 g of this product and 5 g of trimethylmethoxysilane in 20 mL of cyclohexane, stir at room temperature with a magnetic stir bar, add 10 mg of tris(pentafluorophenyl)borane to the aforesaid solution, continue to stir for 30 min, add 5 g activated carbon, followed by centrifugation, filtration and rotary evaporation to obtain the product:

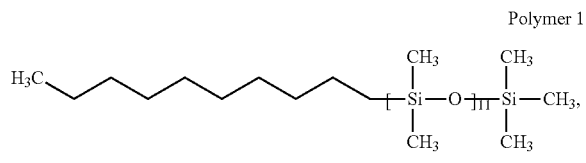

with a yield of 80%;

Preparation of Quantum Dot Composite Solution:

Prepare the aqueous PVA polymer (polymerization degree of 17,000, molecular weight of about 75,000, alcoholysis degree greater than 98%) solution, and prepare CdSe/CdS quantum dot premix (i.e. quantum dots were dissolved in auxiliary solvent, and high boiling point solvent and Polymer 1 were added). The quantum dot premix was added to the aqueous polymer solution, and a quantum dot composite solution with a microstructure was formed at 3,000 rpm with stirring for 3 minutes. Refer to Table 4 and Table 5 for the amount of each component.

Figure 6:
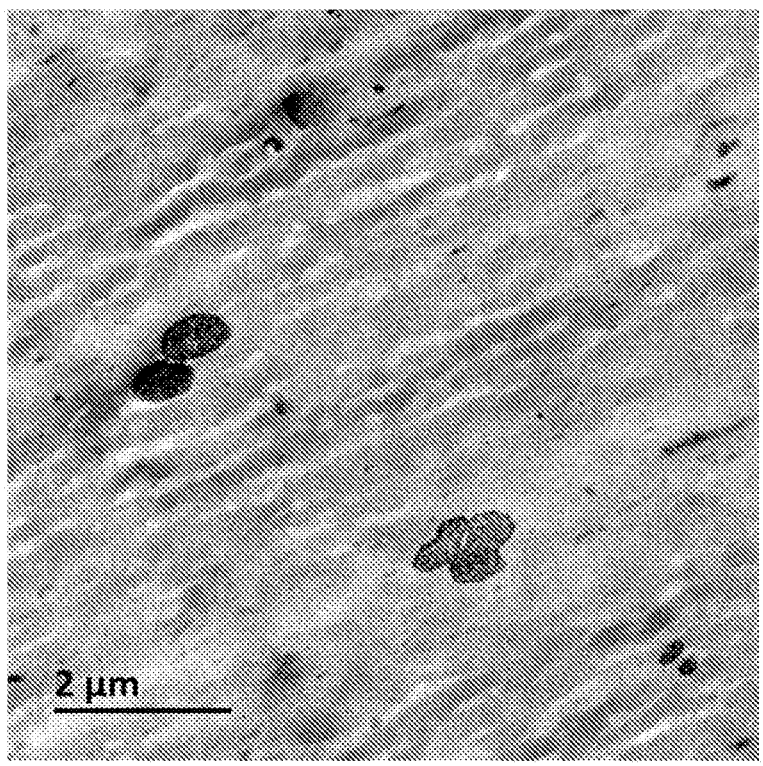
FIG. 6 shows a micrograph of the microcosmic structure of the quantum dot composite layer prepared in Embodiment 9 of this disclosure.
Figure 7:
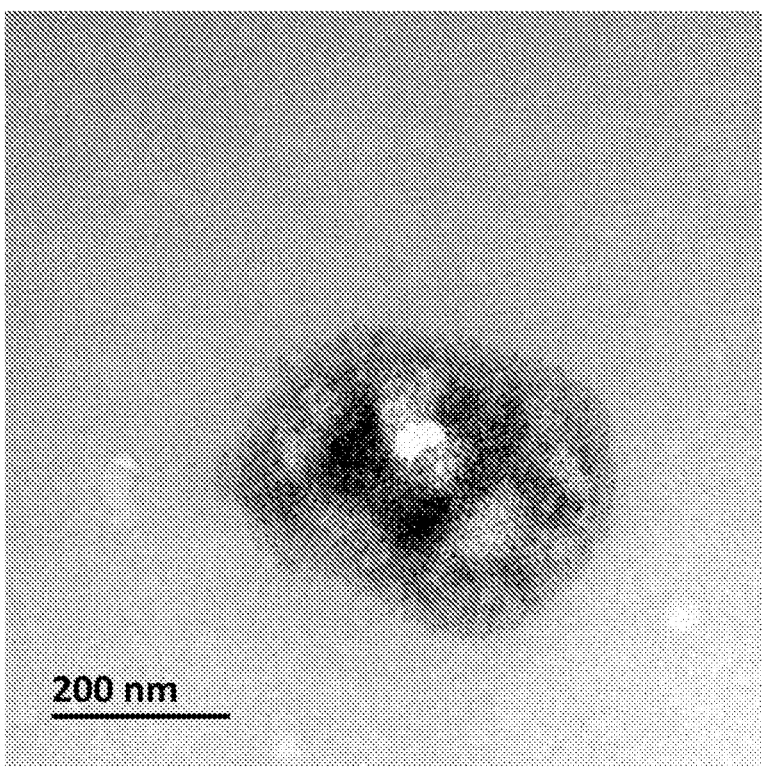
FIG. 7 shows another micrograph of the microcosmic structure of the quantum dot composite layer prepared in Embodiment 9 of this disclosure.

Preparation of Light Emitting Devices:

The prepared coating solution of the second protective layer was provided by spraying on the chip (the chip was pre-installed on the substrate), and after solidification was completed, the quantum dot composite solution was provided on the second protective layer in the same way, so that a wet film with a thickness of 100 microns was formed. Then volatilize the solvents, including the second auxiliary solvent to be volatilized firstly (vacuum drying at 25° C. under vacuum of 10 Pa) and the first auxiliary solvent to be volatilized secondly (two-step heating to prevent the formation of micropores after volatilization, firstly at 50° C. for 30 mins and then at 80° C. for 30 mins), a quantum dot composite layer with a thickness of 10 microns was obtained (the SEM graphs of the quantum dot composite layer were shown in FIGS. 6 and 7). After solidification was completed, the coating solution of the first protective layer was provided on the quantum dot composite layer by the same means and cured, and then the preparation of the QLED was completed.

The aforesaid coating solution of the first protective layer and coating solution of the second protective layer were both tetrahydrofuran solutions of bis(sec-butyl)triethylaluminum orthosilicate. After coating, hydrolysis and solidification occurred to form a protective layer containing both silicon dioxide and aluminum oxide.

Embodiment 10

Polymer 1 was synthesized according to the synthesis method of Polymer 1 in Embodiment 9.

Preparation of Quantum Dot Composite Solution:

Prepare the aqueous PVA polymer (polymerization degree of 17,000, molecular weight of about 75,000, alcoholysis degree greater than 98%) solution, and prepare CdSe/CdS quantum dot premix (i.e. quantum dots were dissolved in auxiliary solvent, and high boiling point solvent and Polymer 1 were added). The quantum dot premix was added to the aqueous polymer solution, and a quantum dot composite solution was formed at 3,000 rpm with stirring for 3 minutes. Refer to Table 4 and Table 5 for the amount of each component.

Preparation of Light Emitting Devices:

The prepared coating solution of the second protective layer was provided by spraying on the chip (the chip was pre-installed on the substrate), and after solidification was completed, the quantum dot composite solution was provided on the second protective layer in the same way, so that a wet film with a thickness of 100 microns was formed. Then volatilize the solvents, including the second auxiliary solvent to be volatilized firstly (vacuum drying at 25° C. under vacuum of 10 Pa) and the first auxiliary solvent to be volatilized secondly (two-step heating to prevent the formation of micropores after volatilization, firstly at 50° C. for 30 mins and then at 80° C. for 30 mins), a quantum dot composite layer with a thickness of 10 microns was obtained. After solidification was completed, the coating solution of the first protective layer was provided on the quantum dot composite layer by the same means and cured, and then the preparation of the QLED was completed.

The aforesaid coating solution of the first protective layer and coating solution of the second protective layer were both tetrahydrofuran solutions of bis(sec-butyl)triethylaluminum orthosilicate. After coating, hydrolysis and solidification reaction occurred to form a protective layer containing both silicon dioxide and aluminum oxide.

Embodiment 11

Polymer 1 was synthesized according to the synthesis method of Polymer 1 in Embodiment 9.

Preparation of Quantum Dot Composite Solution:

Prepare the aqueous PVA polymer (polymerization degree of 17,000, molecular weight of about 75,000, alcoholysis degree greater than 98%) solution, and prepare CdSe/CdS quantum dot premix (i.e. quantum dots were dissolved in auxiliary solvent, and high boiling point solvent and Polymer 1 were added). The quantum dot premix was added to the aqueous polymer solution, and a quantum dot composite solution was formed at 3,000 rpm with stirring for 3 minutes. Refer to Table 4 and Table 5 for the amount of each component.

Preparation of Light Emitting Devices:

The prepared coating solution of the second protective layer was provided by spraying on the chip (the chip was pre-installed on the substrate), and after solidification was completed, the quantum dot composite solution was provided on the second protective layer in the same way, so that a wet film with a thickness of 100 microns was formed. Then volatilize the solvents, including the second auxiliary solvent to be volatilized firstly (vacuum drying at 25° C. under vacuum of 10 Pa) and the first auxiliary solvent to be volatilized secondly (two-step heating to prevent the formation of micropores after volatilization, firstly at 50° C. for 30 mins and then at 80° C. for 30 mins), a quantum dot composite layer with a thickness of 10 microns was obtained. After solidification was completed, the coating solution of the first protective layer was provided on the quantum dot composite layer by the same means and cured, and then the preparation of the QLED was completed.

The aforesaid coating solution of the first protective layer and coating solution of the second protective layer were both tetrahydrofuran solutions of bis(sec-butyl)triethylaluminum orthosilicate. After coating, hydrolysis and solidification occurred to form a protective layer containing both silicon dioxide and aluminum oxide.

Embodiment 12

Polymer 1 was synthesized according to the synthesis method of Polymer 1 in Embodiment 9.

Preparation of Quantum Dot Composite Solution:

Prepare the aqueous PVA polymer (polymerization degree of 17,000, molecular weight of about 75,000, alcoholysis degree greater than 98%) solution, and prepare CdSe/CdS quantum dot premix (i.e. quantum dots were dissolved in auxiliary solvent, and Polymer 1 was added). The quantum dot premix was added to the aqueous polymer solution, and a quantum dot composite solution was formed at 3,000 rpm with stirring for 3 minutes. Refer to Table 4 and Table 5 for the amount of each component.

Preparation of Light Emitting Devices:

The prepared coating solution of the second protective layer was provided by spraying on the chip (the chip was pre-installed on the substrate), and after solidification was completed, the quantum dot composite solution was provided on the second protective layer in the same way, so that a wet film with a thickness of 100 microns was formed. Then volatilize the solvents, including the second auxiliary solvent to be volatilized firstly (vacuum drying at 25° C. under vacuum of 10 Pa) and the first auxiliary solvent to be volatilized secondly (two-step heating to prevent the formation of micropores after volatilization, firstly at 50° C. for 30 mins and then at 80° C. for 30 mins), a quantum dot composite layer with a thickness of 10 microns was obtained. After solidification was completed, the coating solution of the first protective layer was provided on the quantum dot composite layer by the same means and cured, and then the preparation of the QLED was completed.

The aforesaid coating solution of the first protective layer and coating solution of the second protective layer were both tetrahydrofuran solutions of bis(sec-butyl)triethylaluminum orthosilicate. After coating, hydrolysis and solidification occurred to form a protective layer containing both silicon dioxide and aluminum oxide.

Embodiment 13

Synthesis of the Following Siloxane Oligomer:

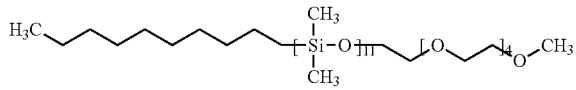

Raw materials: DMS-H11 (gelest), 1-decene (sigma-aldrich), tetraethylene glycol methyl vinyl ether (sigma-aldrich), tris(pentafluorophenyl)borane (sigma-aldrich), Platinum(0)-1,3-divinyl-1,1,3,3-tetramethyldisiloxane (sigma-aldrich).

Add 20 g DMS-H11 and 20 mL anhydrous toluene into a 100 mL three-necked flask, replace with nitrogen for 20 minutes, and add a mixture of 2.67 g decene, 0.01 g Platinum(0)-1,3-divinyl-1,1,3,3-tetramethyldisiloxane and 10 mL toluene into a 50 mL dropping funnel. After the three-necked flask was stirred and heated to 110° C., begin to add the decene mixture dropwise for consecutive 20 minutes, and keep it at 110° C. for 60 minutes. After cooling, add 10 g activated carbon, followed by centrifugation, filtration, chromatographic separation and rotary evaporation to obtain the following product:

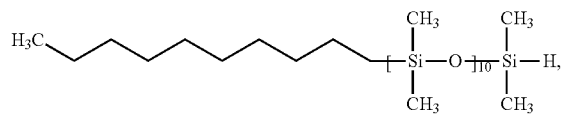

with a yield of 68%;

Add 10 g of the aforesaid product, 3 g tetraethylene glycol methyl vinyl ether and 10 mL anhydrous toluene into a 100 mL three-necked flask, replace with nitrogen for 20 minutes, and add 0.005 g Platinum(0)-1,3-divinyl-1,1,3,3-tetramethyldisiloxane. After the three-necked flask was stirred and heated, keep it at 110° C. for 60 minutes. After cooling, add 5 g activated carbon, followed by centrifugation, filtration, chromatographic separation and rotary evaporation to obtain the product:

Polymer 2

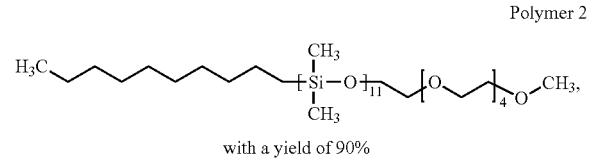

with a yield of 90%

Preparation of Quantum Dot Composite Solution:

Prepare the aqueous PVA polymer (polymerization degree of 17,000, molecular weight of about 75,000, alcoholysis degree greater than 98%) solution, and prepare CdSe/CdS quantum dot premix (i.e. quantum dots were dissolved in auxiliary solvent, and high boiling point solvent and Polymer 2 were added). The quantum dot premix was added to the aqueous polymer solution, and a quantum dot composite solution was formed at 3,000 rpm with stirring for 3 minutes. Refer to Table 4 and Table 5 for the amount of each component.

Preparation of Light Emitting Devices:

The prepared coating solution of the second protective layer was provided by spraying on the chip (the chip was pre-installed on the substrate), and after solidification was completed, the quantum dot composite solution was provided on the second protective layer in the same way, so that a wet film with a thickness of 100 microns was formed. Then volatilize the solvents, including the second auxiliary solvent to be volatilized firstly (vacuum drying at 25° C. under vacuum of 10 Pa) and the first auxiliary solvent to be volatilized secondly (two-step heating to prevent the formation of micropores after volatilization, firstly at 50° C. for 30 mins and then at 80° C. for 30 mins), a quantum dot composite layer with a thickness of 10 microns was obtained. After solidification was completed, the coating solution of the first protective layer was provided on the quantum dot composite layer by the same means and cured, and then the preparation of the QLED was completed.

The aforesaid coating solution of the first protective layer and coating solution of the second protective layer were both tetrahydrofuran solutions of bis(sec-butyl)triethylaluminum orthosilicate. After coating, hydrolysis and solidification occurred to form a protective layer containing both silicon dioxide and aluminum oxide.

Embodiment 14

Synthesis of the Following Siloxane Oligomer:

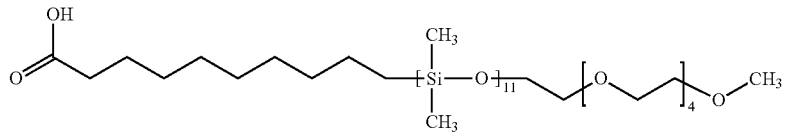

Raw materials: DMS-H11 (gelest), 9-decenoic acid (sigma-aldrich), tetraethylene glycol methyl vinyl ether (sigma-aldrich), tris(pentafluorophenyl)borane (sigma-aldrich), Platinum(0)-1,3-divinyl-1,1,3,3-tetramethyldisiloxane (sigma-aldrich).

Add 20 g DMS-H11 and 20 mL anhydrous toluene into a 100 mL three-necked flask, replace with nitrogen for 20 minutes, and add a mixture of 2.7 g 9-decenoic acid, 0.01 g Platinum(O)-1,3-divinyl-1,1,3,3-tetramethyldisiloxane and 10 mL toluene into a 50 mL dropping funnel. After the three-necked flask was stirred and heated to 110° C., begin to add the 9-decenoic acid mixture dropwise for consecutive 20 minutes, and keep it at 110° C. for 60 minutes. After cooling, add 10 g activated carbon, followed by centrifugation, filtration, chromatographic separation and rotary evaporation to obtain the following product:

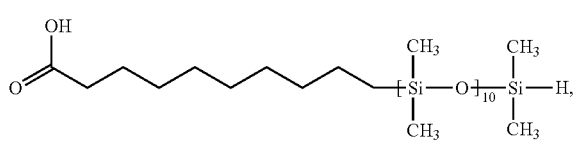

with a yield of 63%;

Add 10 g of the aforesaid product, 3 g tetraethylene glycol methyl vinyl ether and 10 mL anhydrous toluene into a 100 mL three-necked flask, replace with nitrogen for 20 minutes, and add 0.005 g Platinum(0)-1,3-divinyl-1,1,3,3-tetramethyldisiloxane. After the three-necked flask was stirred and heated, keep at 110° C. for 60 minutes. After cooling, add 5 g activated carbon, followed by centrifugation, filtration, chromatographic separation and rotary evaporation to obtain the product:

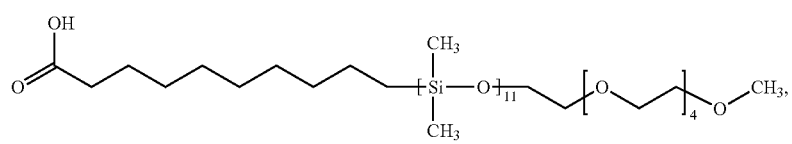

with a yield of 90%:

Preparation of Quantum Dot Composite Solution:

Prepare the aqueous PVA polymer (polymerization degree of 17,000, molecular weight of about 75,000, alcoholysis degree greater than 98%) solution, and prepare CdSe/CdS quantum dot premix (i.e. quantum dots were dissolved in auxiliary solvent, and high boiling point solvent and Polymer 3 were added). The quantum dot premix was added to the aqueous polymer solution, and a quantum dot composite solution was formed at 3,000 rpm with stirring for 3 minutes. Refer to Table 4 and Table 5 for the amount of each component.

Preparation of Light Emitting Devices:

The prepared coating solution of the second protective layer was provided by spraying on the chip (the chip was pre-installed on the substrate), and after solidification was completed, the quantum dot composite solution was provided on the second protective layer in the same way, so that a wet film with a thickness of 100 microns was formed. Then volatilize the solvents, including the second auxiliary solvent to be volatilized firstly (vacuum drying at 25° C. under vacuum of 10 Pa) and the first auxiliary solvent to be volatilized secondly (two-step heating to prevent the formation of micropores after volatilization, firstly at 50° C. for 30 mins and then at 80° C. for 30 mins), a quantum dot composite layer with a thickness of 10 microns was obtained. After solidification was completed, the coating solution of the first protective layer was provided on the quantum dot composite layer by the same means and cured, and then the preparation of the QLED was completed.

The aforesaid coating solution of the first protective layer and coating solution of the second protective layer were both tetrahydrofuran solutions of bis(sec-butyl)triethylaluminum orthosilicate. After coating, hydrolysis and solidification occurred to form a protective layer containing both silicon dioxide and aluminum oxide.

Embodiment 15

Synthesis of the Following Siloxane Oligomer:

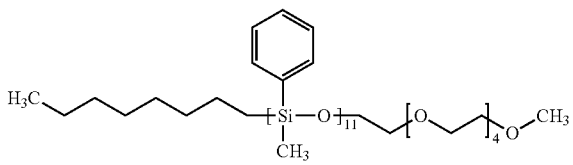

Raw materials: DMS-H11 (gelest), 1-octene (sigma-aldrich), tetraethylene glycol methyl vinyl ether (sigma-aldrich), tris(pentafluorophenyl)borane (sigma-aldrich), Platinum(0)-1,3-divinyl-1,1,3,3-tetramethyldisiloxane (sigma-aldrich).

Add 20 g DMS-H11 and 20 mL anhydrous toluene into a 100 mL three-necked flask, replace with nitrogen for 20 minutes, and add a mixture of 2.5 g 1-octene, 0.01 g Platinum(0)-1,3-divinyl-1,1,3,3-tetramethyldisiloxane and 10 mL toluene into a 50 mL dropping funnel. After the three-necked flask was stirred and heated to 110° C., begin to add the octene mixture dropwise for consecutive 20 minutes, and keep it at 110° C. for 60 minutes. After cooling, add 10 g activated carbon, followed by centrifugation, filtration, chromatographic separation and rotary evaporation to obtain the following product:

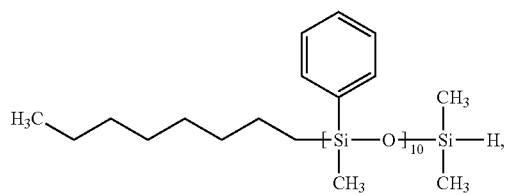

with a yield of 60%;

Add 10 g of the aforesaid product, 3 g tetraethylene glycol methyl vinyl ether and 10 mL anhydrous toluene into a 100 mL three-necked flask, replace with nitrogen for 20 minutes, and add 0.005 g Platinum(0)-1,3-divinyl-1,1,3,3-tetramethyldisiloxane. After the three-necked flask was stirred and heated, keep it at 110° C. for 60 minutes. After cooling, add 5 g activated carbon, followed by centrifugation, filtration, chromatographic separation and rotary evaporation to obtain the product:

Polymer 4

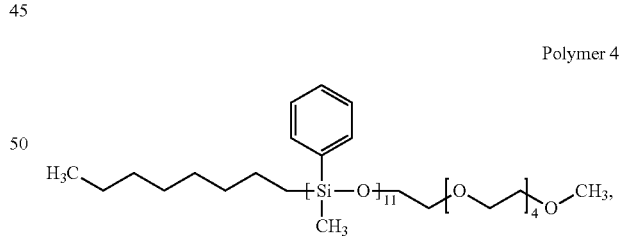

with a yield of 90%

Preparation of Quantum Dot Composite Solution:

Prepare the aqueous PVA polymer (polymerization degree of 17,000, molecular weight of about 75,000, alcoholysis degree greater than 98%) solution, and prepare CdSe/CdS quantum dot premix (i.e. quantum dots were dissolved in auxiliary solvent, and high boiling point solvent and Polymer 4 were added). The quantum dot premix was added to the aqueous polymer solution, and a quantum dot composite solution was formed at 3,000 rpm with stirring for 3 minutes. Refer to Table 4 and Table 5 for the amount of each component.

Preparation of Light Emitting Devices:

The prepared coating solution of the second protective layer was provided by spraying on the chip (the chip was pre-installed on the substrate), and after solidification was completed, the quantum dot composite solution was provided on the second protective layer in the same way, so that a wet film with a thickness of 100 microns was formed. Then volatilize the solvents, including the second auxiliary solvent to be volatilized firstly (vacuum drying at 25° C. under vacuum of 10 Pa) and the first auxiliary solvent to be volatilized secondly (two-step heating to prevent the formation of micropores after volatilization, firstly at 50° C. for 30 mins and then at 80° C. for 30 mins), a quantum dot composite layer with, a thickness of 10 microns was obtained. After solidification was completed, the coating solution of the first protective layer was provided on the quantum dot composite layer by the same means and cured, and then the preparation of the QLED was completed.

The aforesaid coating solution of the first protective layer and coating solution of the second protective layer were both tetrahydrofuran solutions of bis(sec-butyl)triethylaluminum orthosilicate. After coating, hydrolysis and solidification occurred to form a protective layer containing both silicon dioxide and aluminum oxide.

Embodiment 16

Synthesis of the Following Siloxane Oligomer:

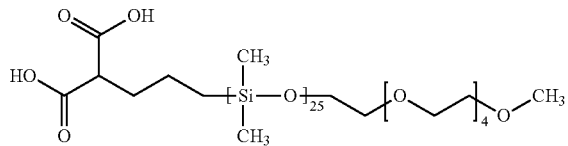

Raw materials: DMS-H11 (gelest), allyl malonic acid (sigma-aldrich), tetraethylene glycol methyl vinyl ether (sigma-aldrich), tris(pentafluorophenyl)borane (sigma-aldrich), Platinum(0)-1,3-divinyl-1,1,3,3-tetramethyldisiloxane (sigma-aldrich).

Add 20 g DMS-H11 and 20 mL anhydrous toluene into a 100 m three-necked flask, replace with nitrogen for 20 minutes, and add a mixture of 2.8 g allyl malonic acid, 0.01 g Platinum(0)-1,3-divinyl-L1,3,3-tetramethyldisiloxane and 10 mL toluene into a 50 mL dropping funnel. After the three-necked flask was stirred and heated to 110° C., begin to add the allyl malonic acid mixture dropwise for consecutive 20 minutes, and keep it at 110° C. for 60 minutes. After cooling, add 10 g activated carbon, followed by centrifugation, filtration, chromatographic separation and rotary evaporation to obtain the following product:

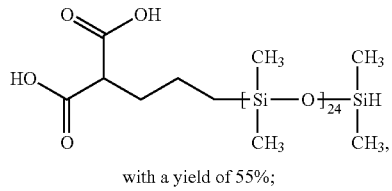

with a yield of 55%;

Add 10 g of the aforesaid product, 3 g tetraethylene glycol methyl vinyl ether and 10 mL anhydrous toluene into a 100 mL three-necked flask, replace with nitrogen for 20 minutes, and add 0.005 g Platinum(0)-1,1-divinyl-1,1,3,3-tetramethyldisiloxane. After the three-necked flask was stirred and heated, keep it at 110° C. for 60 minutes. After cooling, add 5 g activated carbon, followed by centrifugation, filtration, chromatographic separation and rotary evaporation to obtain the product:

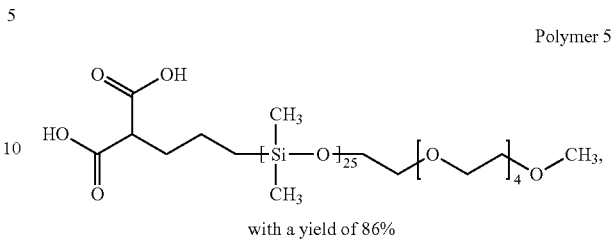

Polymer 5 with a yield of 86%

Preparation of Quantum Dot Composite Solution:

Prepare the aqueous PVA polymer (polymerization degree of 17,000, molecular weight of about 75,000, alcoholysis degree greater than 98%) solution, and prepare CdSe/CdS quantum dot premix (i.e. quantum dots were dissolved in auxiliary solvent, and high boiling point solvent and Polymer 5 were added). The quantum dot premix was added to the aqueous polymer solution, and a quantum dot composite solution was formed at 3,000 rpm with stirring for 3 minutes. Refer to Table 4 and Table 5 for the amount of each component.

Preparation of Light Emitting Devices:

The prepared coating solution of the second protective layer was provided by spraying on the chip (the chip was pre-installed on the substrate), and after solidification was completed, the quantum dot composite solution was provided on the second protective layer in the same way, so that a wet film with a thickness of 100 microns was formed. Then volatilize the solvents, including the second auxiliary solvent to be volatilized firstly (vacuum drying at 25° C. under vacuum of 10 Pa) and the first auxiliary solvent to be volatilized secondly (two-step heating to prevent the formation of micropores after volatilization, firstly at 50° C. for 30 mins and then at 80° C. for 30 mins), a quantum dot composite layer with a thickness of 10 microns was obtained. After solidification was completed, the coating solution of the first protective layer was provided on the quantum dot composite layer by the same means and cured, and then the preparation of the QLED was completed.

The aforesaid coating solution of the first protective layer and coating solution of the second protective layer were both tetrahydrofuran solutions of bis(sec-butyl)triethylaluminum orthosilicate. After coating, hydrolysis and solidification occurred to form a protective layer containing both silicon dioxide and aluminum oxide.

Comparative Embodiment 2

Use of the following Polymer 6 as dispersion medium:

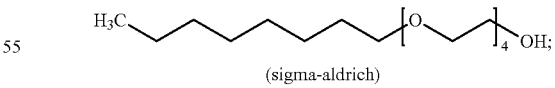

(sigma-aldrich)

Prepare the aqueous PVA polymer (polymerization degree of 17,000, molecular weight of about 75,000, alcoholysis degree greater than 98%) solution, and prepare CdSe/CdS quantum dot premix (i.e. quantum dots were dissolved in auxiliary solvent, and high boiling point solvent and Compound 6 were added). The quantum dot premix was added to the aqueous polymer solution, and a compound with a microstructure was formed at 3,000 rpm with stirring for 3 minutes. Refer to Table 4 and Table 5 for the amount of each component.

The aforesaid mixture with a thickness of 100 microns was coated on the chip (the chip was pre-installed on the substrate), and after solidification, a quantum dot LED including a quantum dot composite with a thickness of 10 microns was obtained.

In the aforesaid embodiments and comparative embodiments, each raw material in the mixture is shown in Table 4, and the ratio between the amounts between each raw material is shown in Table 5.

TABLE 4

Types of raw materials used in each embodiment

| | | | | Dispersion medium of quantum dot | | |
|---|---|---|---|---|---|---|
| | Polymer | Polymer solvent | Quantum dot | Auxiliary solvent of quantum dot | High boiling point solvent | Siloxane oligomer |
| Embodiment 9 | PVA | Water | Oil-soluble quantum dot | Dichloromethane | ODE | Polymer 1 |
| Embodiment 10 | PVA | Water | Oil-soluble quantum dot | Dichloromethane | ODE | Polymer 1 |
| Embodiment 11 | PVA | Water | Oil-soluble quantum dot | Dichloromethane | ODE | Polymer 1 |
| Embodiment 12 | PVA | Water | Oil-soluble quantum dot | Dichloromethane | / | Polymer 1 |
| Embodiment 13 | PVA | Water | Oil-soluble quantum dot | Hexane | Octadecane | Polymer 1 |
| Embodiment 14 | PVA | Water | Oil-soluble quantum dot | Chloroform | Octadecane | Polymer 3 |
| Embodiment 15 | PVA | Water | Oil-soluble quantum dot | Dichloromethane | ODE | Polymer 4 |
| Embodiment 16 | PVA | Water | Oil-soluble quantum dot | Dichloromethane | ODE | Polymer 5 |
| Comparative Embodiment 2 | PVA | Water | Oil-soluble quantum dot | Dichloromethane | ODE | Polymer 6 |

TABLE 5

Amount of each component in each embodiment

| | | | | Dispersion medium of quantum dot | | |
|---|---|---|---|---|---|---|
| | Mass of polymer (g) | Mass of polymer solvent (g) | Mass of quantum dot (g) | Mass of auxiliary solvent (g) | Mass of high boiling point solvent (g) | Mass of siloxane oligomer (g) |
| Embodiment 9 | 100 | 900 | 0.1 | 50 | 1 | 9 |
| Embodiment 10 | 100 | 900 | 0.1 | 30 | 5 | 0.05 |
| Embodiment 11 | 100 | 900 | 30 | 20 | 15 | 15 |
| Embodiment 12 | 100 | 900 | 0.1 | 50 | 0 | 0.1 |
| Embodiment 13 | 100 | 900 | 1 | 50 | 0.5 | 0.5 |
| Embodiment 14 | 100 | 900 | 5 | 50 | 5 | 5 |
| Embodiment 15 | 100 | 900 | 10 | 50 | 5 | 5 |
| Embodiment 16 | 100 | 900 | 10 | 50 | 5 | 5 |
| Comparative Embodiment 2 | 100 | 900 | 0.1 | 50 | 1 | 9 |

The aging stability was characterized as follows:

The performance of the light emitting devices prepared in each of the aforesaid embodiments and comparative embodiments were tested, using the specific testing methods as follows, and the testing results are shown in Table 6.

The method for testing the quantum yield of QLEDs was: using an Everfine integrating sphere to test the average blue light spectrum of the same batch of multiple blue-emissive LED chips lit at a current of 50 mA as the blue light reference spectrum, and then measuring the white light spectrum of the aged sample lit at a current of 50 mA.

Quantum yield of QLED=emission peak area of quantum dots in the spectrum of the aged sample/(blue light reference peak area−blue light peak area in the spectrum of the aged sample)*100%

The measurement method of luminescence stability mainly included 80 mA lighting aging at room temperature, high temperature and humidity (65° C./95% RH), high temperature storage (85° C.) and other aging conditions, and measurement of the change of quantum yield of QLED at a current of 50 mA before and after 1000 h of aging.

The aging data is shown in Table 6:

TABLE 6

| | Quantum yield after 1000 h of aging | | | |
|---|---|---|---|---|
| | Quantum yield | Lighting at room temperature | High temperature storage | High temperature and humidity |
| Embodiment 9 | 106% | 108.2% | 98.2% | 97.7% |
| Embodiment 10 | 105% | 106.3% | 98.3% | 95.8% |
| Embodiment 11 | 100.5% | 96.5% | 94.5% | 92.3% |
| Embodiment 12 | 105.8% | 107.6% | 99.2% | 94.5% |
| Embodiment 13 | 101.2% | 103.5% | 96.4% | 92.0% |
| Embodiment 14 | 109.4% | 110.6% | 101.5% | 98.9% |
| Embodiment 15 | 102.2% | 104.1% | 94.7% | 94.0% |
| Embodiment 16 | 104.1% | 108.9% | 100.3% | 99.5% |
| Comparative Embodiment 2 | 100% | 94.5% | 91.8% | 79.6% |

Note:
The above quantum yields are relative efficiencies. The quantum yield of Comparative Embodiment 2 is set as 100%, and the other quantum yields mean the corresponding percentages.

Note: The above quantum yields are relative efficiencies. The quantum yield of Comparative Embodiment 2 is set as 100%, and the other quantum yields mean the corresponding percentages.

The foregoing descriptions are merely preferred embodiments of the present disclosure and are not intended to limit the present disclosure, and for those skilled in the art, the present disclosure may have various changes and modifications. Any modification, equivalent replacement, and improvement made in the spirit and principle of the present disclosure shall fall within the protection scope of the present disclosure.

What is claimed is:

1. A light emitting device, wherein comprising:
   a substrate;
   an LED chip disposed on a surface of said substrate;
   a quantum dot composite layer arranged on a surface of said LED chip away from said substrate; and
   a first protective layer arranged on a surface of said quantum dot composite layer away from said LED chip;
   wherein, said quantum dot composite layer comprises a water-soluble polymer matrix and quantum dots dispersed in said water-soluble polymer matrix, and the material of said first protective layer is one of a first inorganic oxide and a first water-blocking polymer, and the material of said water-soluble polymer matrix is an oxygen-blocking polymer; the material of said water-soluble polymer matrix is one or more of polyvinylpyrrolidone, polyacrylamide, polyvinyl alcohol, polyacrylic acid, cellulose and alkyd resin; the material of said quantum dot composite layer comprises a water-soluble polymer matrix and a microstructure dispersed in said water-soluble polymer matrix, and said microstructure comprises a quantum dot and a dispersion medium for dispersing said quantum dot, wherein, the polarity of said water-soluble polymer matrix is opposite to the polarity of said quantum dot, and said polarity of said water-soluble polymer matrix is opposite to the polarity of said dispersion medium;
   said quantum dot is an oil-soluble quantum dot, and said dispersion medium is one of a quantum dot solvent and a hydrophobic polymer; said quantum dot solvent is a nonpolar organic solvent; said nonpolar organic solvent has a boiling point of ≥100° C.; said hydrophobic polymer is selected from one or more of compounds represented by the following structures of Formula I, Formula II and Formula III:

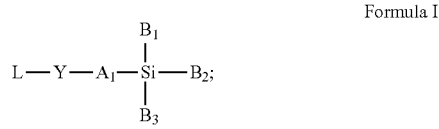
Formula I

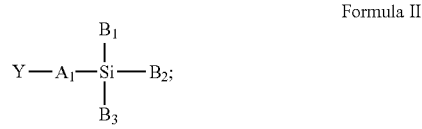
Formula II

Formula III said $A_1$ is

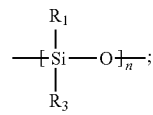

said $A_2$ is

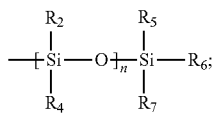

said n is 6~30,
said $R_1$, said $R_2$, said $R_3$ and said $R_4$ are selected independently from any one of methyl, siloxy, phenyl, or combination thereof;
said $R_5$, said $R_6$ and said $R_7$ are selected independently from any one of methyl, phenyl, or combination thereof;
said $B_1$ and said $B_3$ are selected independently from any one of methyl, phenyl, or combination thereof, and said $B_2$ is selected from one of

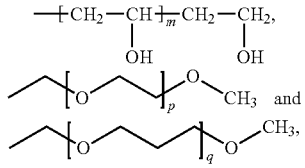

and said m, said p and said q are independently 2~10;
said Y is a $C_3$~$C_{16}$ branched or straight chain alkane segment;
said L is one of an amino, carboxyl and sulfhydryl group.

2. The light emitting device according to claim 1, wherein said light emitting device further comprises a second protective layer, and the material of said second protective layer is one of a second inorganic oxide and a second water-blocking polymer; preferably, said first inorganic oxide and said second inorganic oxide are each independently selected from at least one of silicon dioxide and aluminum oxide; preferably, said first water-blocking polymer and said second water-blocking polymer are each independently selected from one or more of polyvinylidene chloride, poly (vinylidene fluoride), polytetrafluoroethylene and polychlorotrifluoroethene.

3. The light emitting device according to claim 1, wherein the material of said first protective layer is said first inorganic oxide, and said first protective layer is formed by providing one or more solutions of an organic silicate, an organic aluminum silicate and a silazane on said surface of said quantum dot composite layer, and hydrolyzing for solidification.

4. The light emitting device according to claim 1, wherein said light emitting device further comprises a third protective layer and a fourth protective layer, and said third protective layer and said fourth protective layer are respectively disposed on two opposing surfaces of said quantum dot composite layer, and the material of said third protective layer and said fourth protective layer is an oxygen-blocking polymer.

5. The light emitting device according to claim 1, wherein said nonpolar organic solvent has a boiling point of ≥100° C.; a carbon polymerization degree of said $B_2$ is ≤10, more preferably 5.

6. The light emitting device according to claim 5, wherein, when said dispersion medium is said quantum dot solvent, said microstructure further comprises a quantum dot carrier where said quantum dot is loaded, and said quantum dot carrier loaded with said quantum dot is dispersed in said quantum dot solvent;
preferably, said quantum dot carrier is a mesoporous material, and said quantum dot is located in a pore or on a surface of said mesoporous material; more preferably, said mesoporous material is at least one of a silica mesoporous material and an alumina mesoporous material.

7. The light emitting device according to claim 6, wherein, when said dispersion medium is said quantum dot solvent, said microstructure further comprises a free ligand, and said free ligand is dispersed in said quantum dot solvent;
preferably, said free ligand is one or more of fatty acid, fatty acid salt, fatty amine, organic phosphine and thiol; more preferably, said free ligand is one or more of tri-n-octylphosphine, oleic acid and zinc oleate.

8. The light emitting device according to claim 1, wherein the material of said water-soluble polymer matrix is polyvinyl alcohol;
preferably, a weight ratio of said quantum dot to said water-soluble polymer matrix is 0.1-30:100; a weight ratio of said quantum dot to said dispersion medium is 1-100:100.

9. A manufacturing method of the light emitting device according to claim 1, wherein comprising steps of:
providing a substrate;
disposing an LED chip on a surface of said substrate;
arranging a quantum dot composite layer on a surface of said LED chip away from said substrate;
and arranging a first protective layer on a surface of said quantum dot composite layer away from said LED chip to obtain a light emitting device;
wherein, said quantum dot composite layer comprises a water-soluble polymer matrix and quantum dots dispersed in said water-soluble polymer matrix, and the material of said first protective layer is one of a first inorganic oxide and a first water-blocking polymer, and the material of said water-soluble polymer matrix is an oxygen-blocking polymer.

10. The manufacturing method according to claim 9, wherein before said step of arranging said quantum dot composite layer on said surface of said LED chip, said manufacturing method further comprises a step of disposing a second protective layer on a surface of said quantum dot composite layer, and in said step of arranging said quantum dot composite layer on said surface of said LED chip, disposing said second protective layer close to said LED chip; wherein the material of said second protective layer is one of a second inorganic oxide and a second water-blocking polymer.

11. The manufacturing method according to claim 9, wherein said material of said first protective layer is said first inorganic oxide,
and said step of arranging said first protective layer comprises: preparing a coating solution of said first protective layer, coating, spraying or pouring said coating solution of said first protective layer onto said surface of said quantum dot composite layer away from said LED chip, and hydrolyzing for solidification to form said first protective layer; wherein, said coating solution of said first protective layer comprises a coating solvent and one or more of an organic silicate, an organic aluminum silicate and a silazane dissolved in said coating solvent.

12. The manufacturing method according to claim 11, wherein said organic silicate is tetraethyl silicate, said organic aluminum silicate is bis(sec-butyl)triethylaluminum orthosilicate, and said silazane is perhydropolysilazane; preferably, said coating solvent is one or more of tetrahydrofuran, ethyl acetate and acetone.

13. The manufacturing method according to claim 9, wherein before said step of arranging said quantum dot composite layer on said surface of said LED chip, said manufacturing method further comprises a step of disposing a third protective layer on said surface of said LED chip; before said step of arranging said first protective layer on said surface of said quantum dot composite layer, said manufacturing method further comprises disposing a fourth protective layer on said surface away from said third protective layer of said quantum dot composite layer; the material of said third protective layer and said fourth protective layer is an oxygen-blocking polymer.

* * * * *